United States Patent
Kim

(10) Patent No.: US 8,379,406 B2
(45) Date of Patent: Feb. 19, 2013

(54) PACKAGE AND METHOD FOR MANUFACTURING THE SAME

(75) Inventor: Heung Ku Kim, Chungcheongbuk-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 174 days.

(21) Appl. No.: 13/035,503

(22) Filed: Feb. 25, 2011

(65) Prior Publication Data

US 2012/0155047 A1 Jun. 21, 2012

(30) Foreign Application Priority Data

Dec. 21, 2010 (KR) .................. 10-2010-0131635

(51) Int. Cl.
*H01R 11/12* (2006.01)
(52) U.S. Cl. .................. 361/790; 361/760
(58) Field of Classification Search .......... 361/783, 361/760–764, 790, 782, 792; 174/250, 255, 174/259–261; 29/830, 592.1, 825; 257/724, 257/780, 787
See application file for complete search history.

(56) References Cited

U.S. PATENT DOCUMENTS

| | | | |
|---|---|---|---|
| 7,863,100 B2 * | 1/2011 | Yang et al. | 438/109 |
| 8,270,176 B2 * | 9/2012 | Pagaila et al. | 361/760 |
| 2005/0051903 A1 * | 3/2005 | Ellsberry et al. | 257/777 |
| 2012/0074585 A1 * | 3/2012 | Koo et al. | 257/774 |
| 2012/0225522 A1 * | 9/2012 | Zhao et al. | 438/107 |

* cited by examiner

*Primary Examiner* — Yuriy Semenenko
(74) *Attorney, Agent, or Firm* — Blakely Sokoloff Taylor & Zafman LLP

(57) ABSTRACT

Disclosed herein are a package and a method for manufacturing the same. The package includes: a first package including a first printed circuit board having a first surface and a second surface and having a first die mounted on the first surface, the first die having a through silicon via; a second package including a second printed circuit board having a first surface and a second surface and having a second die mounted on the first surface, the second die having a through silicon via; first external connecting terminals electrically interconnecting the first surface of the first printed circuit and the first surface of the second printed circuit disposed to be opposite to each other; and first connecting bumps electrically interconnecting the first and second dice. Therefore, power signals are independently applied to each of the dice, thereby making it possible to improve power stability of each of the dice.

12 Claims, 2 Drawing Sheets

PACKAGE AND METHOD FOR MANUFACTURING THE SAME

CROSS REFERENCE TO RELATED APPLICATION

This application claims the benefit of Korean Patent Application No. 10-2010-0131635, filed on Dec. 21, 2010, entitled "Package and Method for Manufacturing the Same", which is hereby incorporated by reference in its entirety into this application.

BACKGROUND OF THE INVENTION

1. Technical Field

The present invention relates to a package and a method for manufacturing the same.

2. Description of the Related Art

In accordance with the demand for multi-function, compactness, and high performance in the electronic industry, attempts to dispose various semiconductors such as a system in package (SIP) semiconductor, a system on chip (SoC) semiconductor, or the like, to be adjacent to each other have been conducted.

In addition, a semiconductor having a through silicon via (TSV) structure is very useful in terms of high performance and compactness. Research into a method for mounting a printed circuit board has been conducted in order to maximize performance of the semiconductor having the through silicon via (TSV) structure.

Furthermore, in accordance with the demand for high-performance and high-speed semiconductor, a transistor has been integrated in the semiconductor an operating speed of the semiconductor has increased, such that a problem associated with power stability of the semiconductor has been caused.

In order to solve the problem, attempts to reduce inductance for a current path by reducing a length of a via and a wiring of a substrate and to reduce impedance of a network to which power is transferred by disposing a capacitor to be adjacent to the semiconductor have been conducted.

SUMMARY OF THE INVENTION

The present invention has been made in an effort to provide a package having a die stack structure including a through silicon via (TSV) capable of improving power stability of each of the dice by independently applying power signals to each of the dice.

Further, the present invention has been made in an effort to provide a package having a die stack structure including a TSV capable of improving the final yield of the package by assembling the package after electrical performance verification for each of the dice is completed.

Further, the present invention has been made in an effort to provide a package having a die stack structure capable of more smoothly performing heat radiation.

According to a first preferred embodiment of the present invention, there is provided a package, including: a first package including a first printed circuit board having a first surface and a second surface and having a first die mounted on the first surface, the first die having a through silicon via; a second package including a second printed circuit board having a first surface and a second surface and having a second die mounted on the first surface, the second die having a through silicon via; first external connecting terminals electrically interconnecting the first surface of the first printed circuit and the first surface of the second printed circuit disposed to be opposite to each other; and first connecting bumps electrically interconnecting the first and second dice.

Each of the first and second dice may have an active surface formed on mounting surfaces of the first and second printed circuit boards.

The package may further include second connecting bumps electrically interconnecting the first printed circuit board and the first die.

The package may further include third connecting bumps electrically interconnecting the second printed circuit board and the second die.

The package may further include a power plane or a ground plane formed on the second surface of the second printed circuit board.

The package may further include second connecting terminals formed on the second surface of the first printed circuit board.

According to a second preferred embodiment of the present invention, there is provided a method for manufacturing a package, including: mounting a first die having a through silicon via formed therein on a first surface of a first printed circuit board having a first surface and a second surface to prepare a first package; mounting a second die having a through silicon via formed therein on a first surface of a second printed circuit board having a first surface and a second surface to prepare a second package; disposing the first surface of the first printed circuit and the first surface of the second printed circuit to be opposite to each other; forming first external connecting terminals between the first surface of the first printed circuit and the first surface of the second printed circuit so that the first surface of the first printed circuit and the first surface of the second printed circuit are electrically interconnected; and forming first connecting bumps between the first and second dice so that the first and second dice are electrically interconnected.

Each of the first and second dice may have an active surface formed on mounting surfaces of the first and second printed circuit boards.

The method for manufacturing a package may further include forming second connecting bumps electrically interconnecting the first printed circuit board and the first die.

The method for manufacturing a package may further include forming third connecting bumps electrically interconnecting the second printed circuit board and the second die.

The method for manufacturing a package may further include forming a power plane or a ground plane on the second surface of the second printed circuit board.

The method for manufacturing a package may further include forming second connecting terminals on the second surface of the first printed circuit board.

DESCRIPTION OF THE PREFERRED EMBODIMENTS

Figure 1:
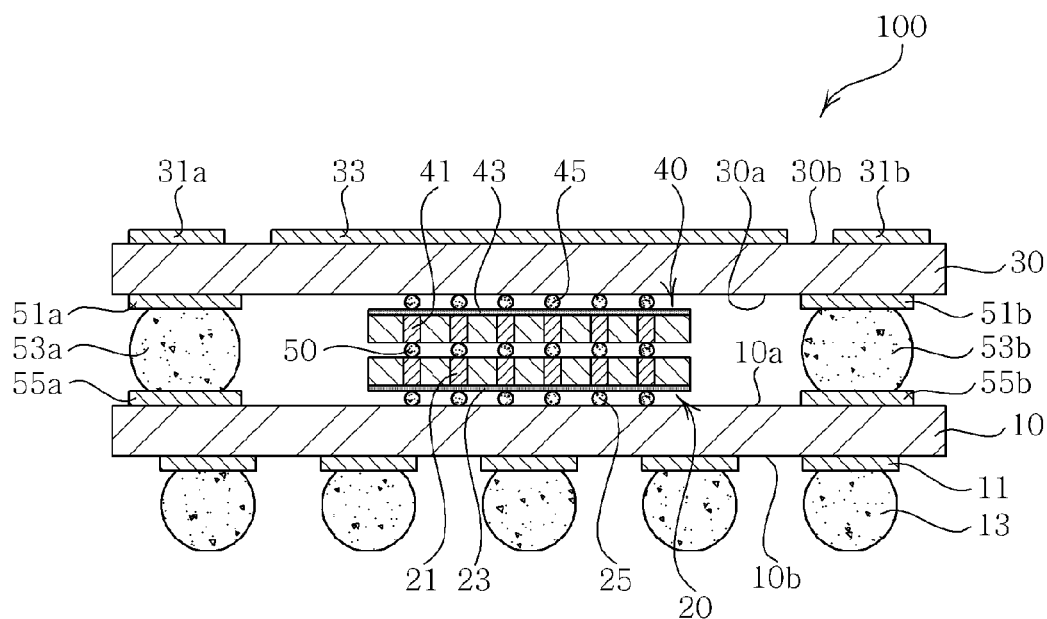
FIG. 1 is a cross-sectional view showing a structure of a package according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, a detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Package

Figure 2:
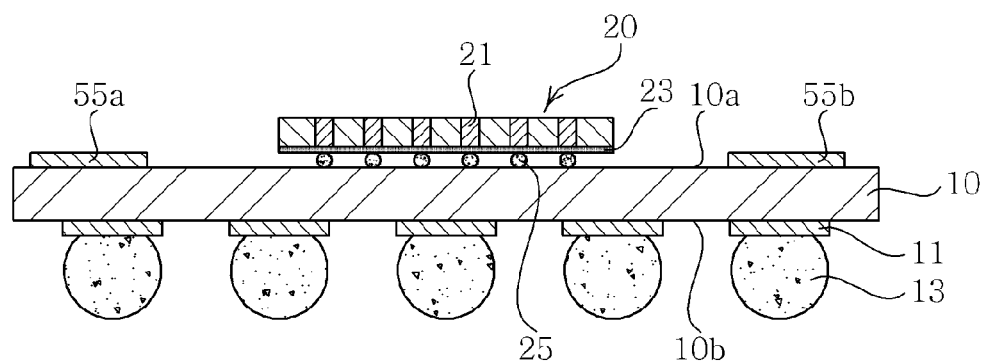
FIG. 2 is a cross-sectional view showing a structure of a first package according to a preferred embodiment of the present invention.
Figure 3:
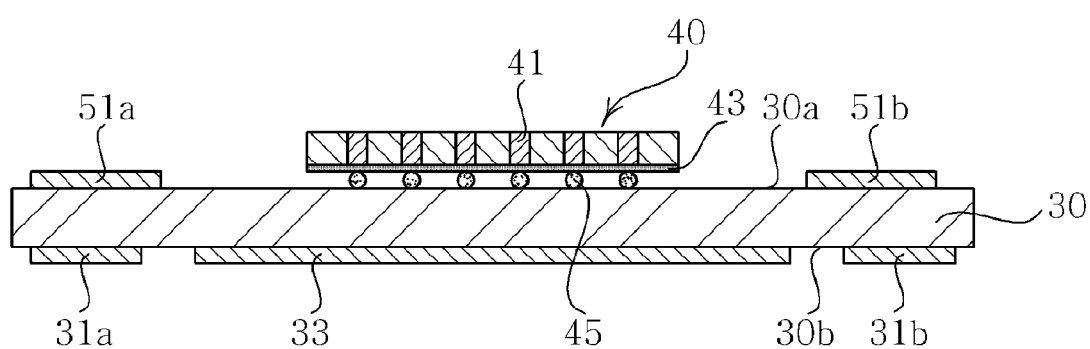
FIG. 3 is a cross-sectional view showing a structure of a second package according to a preferred embodiment of the present invention.

FIG. 1 is a cross-sectional view showing a structure of a package according to a preferred embodiment of the present invention, FIG. 2 is a cross-sectional view showing a structure of a first package according to a preferred embodiment of the present invention, and FIG. 3 is a cross-sectional view showing a structure of a second package according to a preferred embodiment of the present invention.

As shown in FIGS. 1 to 3, a package 100 includes a first package and a second package.

More specifically, as shown in FIGS. 1 and 2, the first package includes a first printed circuit board 10 having a first surface 10a and a second surface 10b and having a first die 20 mounted on the first surface 10a, wherein the first die 20 has a through silicon via (TSV) 21.

Herein, the first die 20 has an active surface 23 formed on a mounting surface of the first printed circuit board 10. The active surface is defined as a surface connected to a surface on which active elements such as a transistor, a diode, and the like, will be mounted.

In addition, the first package includes second connecting bumps 25 electrically connecting the first printed circuit board 10 to the first die 20.

Furthermore, the first package further includes second external connecting terminals 13 formed on the second surface 10b of the first printed circuit board 10.

As shown in FIGS. 1 and 3, the second package includes a second printed circuit board 30 having a first surface 30a and a second surface 30b and having a second die 40 mounted on the first surface 30a, wherein the second die 40 has a TSV 41.

Herein, the second die 40 has an active surface 43 formed on a mounting surface of the second printed circuit board 30.

The active surfaces denoted by reference numerals 23 and 43 correspond to surfaces that should be particularly protected as compared to other surfaces for connecting to active elements (not shown), or the like. Therefore, the active surface according to a preferred embodiment of the present invention is formed on a die surface corresponding to the mounting surface of the printed circuit board and is thus exposed to the outside during a manufacturing process of the package, thereby making it possible to be protected from the risk of damage.

In addition, the second package includes third connecting bumps 45 electrically connecting the second printed circuit board 30 to the second die 40.

Furthermore, as shown in FIG. 3, the second package includes a power plane or a ground plane 33 formed on the second surface 30b of the second printed circuit board 30.

Herein, the power plane or the ground plane 33 having a structure in which it is widely distributed on a top of the package formed by assembling the first and second packages may effectively radiate heat generated from the package, thereby making it possible to improve a heat radiation effect.

In addition, connecting pads denoted by reference numerals 55a, 55b, and 11 may also be applied as wirings of power, ground, or signal input/output (I/O), and may be changed in design as needed by operators.

Meanwhile, as shown in FIG. 1, the package may include first external connecting terminals 53a and 53b electrically connecting the first surface of 10a of the first printed circuit board 10 and the first surface 30a of the second printed circuit board 30, which are disposed to be opposite to each other, and first connecting bumps 50 electrically connecting the first die 20 and the second die 40.

As described above, each of the first die 20 and the second die 40 is mounted on the first printed circuit board 10 and the second printed circuit board 30 through the second connecting bumps 25 and the third connecting bump 45, which are flip-chip bumps, and electrical performances of each of the first die 20 and the second die 40 are independently verified through each of the printed circuit boards in a state before the first and second packages are assembled, thereby making it possible to improve the final yield of the package.

To this end, each of the first and second packages is formed with the connecting pads corresponding to the wirings of power/ground and the wirings of signal input/output (I/O), such that each of the first and second packages may independently receive signals.

More specifically, the connecting pads on a second package side denoted by reference numerals 31a, 31b, 51a, and 51b may also be applied as the wirings of power, ground, signal input/output (I/O), or the like, and may be changed in design as needed by operators.

The connecting pad denoted by the above-mentioned reference numeral 51a may be preferably formed as a power pad or a ground pad; however, is not limited thereto.

However, the second package should include at least one power pad so that the second package itself may independently receive a power signal.

In a package using a general through silicon via, first and second dice are interconnected through the through silicon via to share power/ground, thereby causing problems such as simultaneous switching noise (SSN), etc., due to the supply of the power/ground from the first die. Therefore, when power stability is weakened, it also has an influence on power/ground stability of the second die.

In order to solve the problems, according to a preferred embodiment of the present invention, each of the powers/grounds of the first die 20 and the second die 40 is separately supplied, such that the second die 40 may secure power stability due to the independent power/ground.

For example, when the first die 20 receives the power signal from a mother board (not shown) to be disposed under the second external connecting terminals 13, it is connected to the power or the ground through a path from the second external connecting terminal 13 to the second connecting bump 25 via the connecting pad 11. Herein, the mother board is defined as a main board having electronic components mounted thereon, the electronic components being required for performing several functions including the power signal application of the package.

Meanwhile, when the second die 40 receives the power signal from the mother board to be disposed under the second external connecting terminals 13 independently from the first die 20, it is connected to the power or the ground through a path from the second external connecting terminal 13 to the third connecting bump 45 via the connecting pads 11, the connecting pad 55b, the first external connecting terminal 53b and the connecting pad 51b or a path from the connecting pad 11 to the third connecting bump 45 via the connecting pad 55b, the first external connecting terminal 53b, the connecting pad 51b and the connecting pad 31b.

The above-mentioned power transfer path is described by way of example, and may be changed according to design for a role of the connecting pad.

Although not shown, the first printed circuit board 10 and the second printed circuit board 30 may include a via and/or a circuit for transferring the signal or the power transmitted from the mother board.

Method for Manufacturing Package

Hereinafter, a method for manufacturing a package including mounting each of the first die and the second die each having the through silicon via formed therein on the printed circuit board through a flip-chip bump process, forming solder bumps on each of the first and second packages through a solder printing method or a microball bumping method, aligning the first and second packages, and bonding the first and second packages through a reflow process will be described with reference to FIGS. 1 to 3.

First, as shown in FIG. 2, the first die 20 having the through silicon via 21 formed therein is mounted on the first surface 10a of the first printed circuit board 10 having the first surface 10a and the second surface 10b to prepare the first package.

Herein, the through silicon via is formed by using a scheme of forming a through hole by laser drilling, dry etching, or wet etching and then filling the through hole, without being limited thereto.

Meanwhile, the first die 20 has the active surface 23 formed on the mounting surface of the first printed circuit board 10. The active surface is defined as the surface connected to the surface on which the active elements such as the transistor, the diode, and the like, will be mounted.

In addition, the second connecting bumps 25 electrically connecting the first printed circuit board 10 to the first die 20 may be formed. The second connecting bumps 25 may be formed when the first die 20 is mounted on the first printed circuit board 10.

Further, the second external connecting terminals 13 may be formed on the second surface 10b of the first printed circuit board 10.

Although not shown, the mother board serving to apply the power signal, etc., may be disposed under the second external connecting terminals 13.

As shown in FIG. 3, the second die 40 having the through silicon via 41 formed therein is mounted on the first surface 30a of the second printed circuit board 30 having the first surface 30a and the second surface 30b to prepare the second package.

Herein, the second die 40 has the active surface 43 formed on the mounting surface of the second printed circuit board 30.

In addition, the third connecting bumps 45 electrically connecting the second printed circuit board 30 to the second die 40 may be formed. The third connecting bumps 45 may be formed when the second die 40 is mounted on the second printed circuit board 30.

Further, the power plane or the ground plane 33 may be formed on the second surface 30b of the second printed circuit board 30.

Herein, the power plane or the ground plane 33 having the structure in which it is widely distributed on the top of the package formed by assembling the first and second packages may effectively radiate the heat generated from the package, thereby making it possible to improve the heat radiation effect.

Meanwhile, the connecting pads denoted by the reference numerals 31a, 31b, 55a, and 51b may be formed as the wirings of a power supply, a ground, or a signal input/output (I/O), etc., and may be changed in design as needed by the operators.

In addition, the connecting pad denoted by the above-mentioned reference numeral 51a may be preferably formed as the power pad or the ground pad; however, is not limited thereto.

However, the second package should include at least one power pad so that the second package itself may independently receive the power signal.

In addition, the connecting pads denoted by the reference numerals 55a, 55b, and 11 may also be formed as the wirings of the power, the ground, or the signal input/output (I/O), and may be changed in design as needed by the operators.

As described above, since each of the first and second packages includes the connecting pad capable of receiving the power signal, the electrical performances of the first die 20 and the second die 40 may be verified before the first and second packages are assembled.

For example, when the connecting pad denoted by the reference numeral 51a is designed as the power pad and is used to verify the electrical performance of the second die 40, the power signal applied through an apparatus for verifying the electrical performance is received from the power pad 51a to verify the electrical performance of the second die 40.

Then, as shown in FIG. 1, the first surface 10a of the first printed circuit board 10 and the first surface 30a of the second printed circuit board 30 are disposed to be opposite to each other.

In addition, the first external connecting terminals 53a and 53b are formed between the first surface 10a of the first printed circuit board 10 and the first surface 30a of the second printed circuit board 30 so that the first surface 10a of the first printed circuit board 10 and the first surface 30a of the second printed circuit board 30 are electrically interconnected.

In addition, the first connecting bumps 50 are formed between the first die 20 and the second die 40 so that the first die 20 and the second die 40 are electrically interconnected.

With the package and the method for manufacturing the same according to preferred embodiments of the present invention, the package having the die stack structure including the through silicon via may independently apply the power signal to each of the dice, thereby making it possible to improve power stability of each of the dice.

In addition, according to preferred embodiments of the present invention, since the package having the die stack structure including the through silicon via may independently apply the power signals to each of the dice, the package may be assembled after electrical performance verification for each of the dice is completed to reduce a defective rate of the package, thereby making it possible to improve the final yield of the package.

Furthermore, according to preferred embodiments of the present invention, the package having the die stack structure has a power/ground plane formed therein, thereby making it possible to further improve heat radiation effect for heat generated from the package.

Although the preferred embodiments of the present invention have been disclosed for illustrative purposes, they are for specifically explaining the present invention and thus the package and the method for manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A package comprising:
a first package including a first printed circuit board having a first surface and a second surface and having a first die mounted on the first surface, the first die having a through silicon via;
a second package including a second printed circuit board having a first surface and a second surface and having a second die mounted on the first surface, the second die having a through silicon via;
first external connecting terminals electrically interconnecting the first surface of the first printed circuit and the first surface of the second printed circuit disposed to be opposite to each other; and
first connecting bumps electrically interconnecting the first and second dice.

2. The package as set forth in claim 1, wherein each of the first and second dice has an active surface formed on mounting surfaces of the first and second printed circuit boards.

3. The package as set forth in claim 1, further comprising second connecting bumps electrically interconnecting the first printed circuit board and the first die.

4. The package as set forth in claim 1, further comprising third connecting bumps electrically interconnecting the second printed circuit board and the second die.

5. The package as set forth in claim 1, further comprising a power plane or a ground plane formed on the second surface of the second printed circuit board.

6. The package as set forth in claim 1, further comprising second connecting terminals formed on the second surface of the first printed circuit board.

7. A method for manufacturing a package, comprising:
mounting a first die having a through silicon via formed therein on a first surface of a first printed circuit board having a first surface and a second surface to prepare a first package;
mounting a second die having a through silicon via formed therein on a first surface of a second printed circuit board having a first surface and a second surface to prepare a second package;
disposing the first surface of the first printed circuit and the first surface of the second printed circuit to be opposite to each other;
forming first external connecting terminals between the first surface of the first printed circuit and the first surface of the second printed circuit so that the first surface of the first printed circuit and the first surface of the second printed circuit are electrically interconnected; and
forming first connecting bumps between the first and second dice so that the first and second dice are electrically interconnected.

8. The method for manufacturing a package as set forth in claim 7, wherein each of the first and second dice has an active surface formed on mounting surfaces of the first and second printed circuit boards.

9. The method for manufacturing a package as set forth in claim 7, further comprising forming second connecting bumps electrically interconnecting the first printed circuit board and the first die.

10. The method for manufacturing a package as set forth in claim 7, further comprising forming third connecting bumps electrically interconnecting the second printed circuit board and the second die.

11. The method for manufacturing a package as set forth in claim 7, further comprising forming a power plane or a ground plane on the second surface of the second printed circuit board.

12. The method for manufacturing a package as set forth in claim 7, further comprising forming second connecting terminals on the second surface of the first printed circuit board.

* * * * *